United States Patent
Mull et al.

(10) Patent No.: US 10,574,036 B2
(45) Date of Patent: Feb. 25, 2020

(54) VEHICLE WITH A FIREPROOF ELECTRICAL NETWORK

(71) Applicant: SIEMENS MOBILITY GMBH, Munich (DE)

(72) Inventors: Peter Mull, Nuremberg (DE); Iossif Tokman, Nuremberg (DE)

(73) Assignee: Siemens Mobility GmbH, Munich (DE)

( * ) Notice: Subject to any disclaimer, the term of this patent is extended or adjusted under 35 U.S.C. 154(b) by 81 days.

(21) Appl. No.: 15/504,347

(22) PCT Filed: Jul. 24, 2015

(86) PCT No.: PCT/EP2015/066995
§ 371 (c)(1),
(2) Date: Feb. 16, 2017

(87) PCT Pub. No.: WO2016/026651
PCT Pub. Date: Feb. 25, 2016

(65) Prior Publication Data
US 2017/0237240 A1    Aug. 17, 2017

(30) Foreign Application Priority Data

Aug. 19, 2014   (DE) .......................... 10 2014 216 425

(51) Int. Cl.
*H02B 1/28*    (2006.01)
*B61D 49/00*   (2006.01)
(Continued)

(52) U.S. Cl.
CPC ................. *H02B 1/28* (2013.01); *A62C 3/07* (2013.01); *A62C 3/16* (2013.01); *B60R 16/023* (2013.01); *B61D 49/00* (2013.01); *B61L 15/00* (2013.01); *B61L 15/0036* (2013.01); *H05K 1/18* (2013.01); *B61D 17/04* (2013.01); *H05K 2201/10053* (2013.01)

(58) Field of Classification Search
CPC ........ B61L 15/0036; B61L 15/00; A62C 3/16; H02B 1/28; H05K 1/18
USPC ...................................................... 244/129.2
See application file for complete search history.

(56) References Cited

U.S. PATENT DOCUMENTS 3,146,052 A * 8/1964 Burch ................... H01R 13/741
                                                174/153 R
4,628,235 A * 12/1986 Goings ..................... H02P 7/06
                                                    318/430
(Continued)

FOREIGN PATENT DOCUMENTS

CA      2324432 A1    4/2001
DE      10349573 A1   6/2004
(Continued)

*Primary Examiner* — Scott A Browne
(74) *Attorney, Agent, or Firm* — Laurence Greenberg; Werner Stemer; Ralph Locher

(57) ABSTRACT

A vehicle, in particular for conveying people and/or freight, includes at least one fireproof electrical network, at least one first vehicle region having a first fire load, and at least one second vehicle region having a second fire load that is smaller than the first fire load. In order to keep the necessary fireproofing as low as possible, at least part of the fireproof electrical network is disposed in the second vehicle region.

6 Claims, 3 Drawing Sheets

(51) Int. Cl.
*B60R 16/023* (2006.01)
*B61L 15/00* (2006.01)
*A62C 3/07* (2006.01)
*A62C 3/16* (2006.01)
*H05K 1/18* (2006.01)
*B61D 17/04* (2006.01)

(56) References Cited

U.S. PATENT DOCUMENTS

| | | | | |
|---|---|---|---|---|
| 7,120,030 | B2* | 10/2006 | Azumi | B60R 16/0239 361/752 |
| 8,807,486 | B2* | 8/2014 | Beyer | B61L 15/0036 246/166.1 |
| 9,993,989 | B2* | 6/2018 | Kawka | B32B 5/024 |
| 2004/0103113 | A1 | 5/2004 | Sato et al. | |
| 2006/0146699 | A1* | 7/2006 | Sept | B61L 15/0036 370/221 |
| 2009/0195344 | A1 | 8/2009 | Marvel et al. | |
| 2009/0206059 | A1* | 8/2009 | Kiko | H02J 3/14 218/143 |
| 2012/0196652 | A1* | 8/2012 | Lee | H04M 1/0277 455/557 |
| 2012/0318921 | A1* | 12/2012 | Rohrbach | A62C 99/0018 244/129.2 |
| 2012/0318930 | A1* | 12/2012 | Beyer | B61L 15/0036 246/167 R |
| 2014/0211773 | A1* | 7/2014 | Chang | H04W 88/08 370/338 |
| 2015/0054397 | A1 | 2/2015 | Weiler | |
| 2015/0343736 | A1* | 12/2015 | Kawka | H01M 2/1686 429/144 |
| 2016/0144871 | A1* | 5/2016 | Jalla | B60L 1/003 105/27 |
| 2016/0359741 | A1* | 12/2016 | Cooper | B61C 17/12 |
| 2018/0029614 | A1* | 2/2018 | Mull | B61C 17/00 |

FOREIGN PATENT DOCUMENTS

| | | |
|---|---|---|
| DE | 102005059941 A1 | 8/2006 |
| DE | 102005057541 A1 | 6/2007 |
| DE | 102005057542 A1 | 6/2007 |
| DE | 102010020471 A1 | 11/2011 |
| DE | 102011081785 A1 | 2/2013 |
| DE | 102012204300 B3 | 4/2013 |
| EP | 1095836 A2 | 5/2001 |
| EP | 1662453 A1 | 5/2006 |
| EP | 1792762 A1 | 6/2007 |
| EP | 2423066 A2 | 2/2012 |
| EP | 2433676 A2 | 3/2012 |
| JP | H0833122 A | 2/1996 |
| RU | 61655 U1 | 3/2007 |
| RU | 96077 U1 | 7/2010 |
| WO | 2006067070 A1 | 6/2006 |
| WO | 2011104278 A1 | 9/2011 |
| WO | 2011138416 A2 | 11/2011 |

* cited by examiner

VEHICLE WITH A FIREPROOF ELECTRICAL NETWORK

BACKGROUND OF THE INVENTION

Field of the Invention

The invention relates to a vehicle for conveying people and/or freight in particular, having at least one fireproof electrical network, at least one first vehicle region which has a first fire load, and at least one second vehicle region which has a fire load that is smaller than the first fire load.

Such vehicles include e.g. rail-borne vehicles, in which the first vehicle region is e.g. an under floor region and the second vehicle region is e.g. a passenger region. In such vehicles, provision is usually made for a fireproof electrical network which is part of an overall electrical network and requires particular protection against the effects of a fire that might occur. The fireproof electrical network comprises, for example, a fire alarm system which is linked to fire alarms or smoke alarms in the vehicle and outputs an alarm signal in the event of a fire, an emergency travel device by means of which the vehicle is able to continue traveling for a length of time in the event of a fire, or a public information system which outputs e.g. spoken instructions to the passengers in the event of a fire. With regard to the functions performed by the fireproof electrical network, it must be ensured that these remain available in the event of a fire in the vehicle. The fireproofing may be effected by means of a separate fire-protective housing or a fire-protective casing, for example. The embodiment of the fireproof electrical network in the vehicle represents a significant expense in terms of cost and assembly.

BRIEF SUMMARY OF THE INVENTION

The object of the present invention is therefore to provide a vehicle of the type cited in the introduction, in which the fireproof electrical network is connected at lower expense.

The cited object is achieved by the vehicle cited in the introduction, by virtue of at least part of the fireproof network being arranged in the second vehicle region.

This has the advantage that in the second region, which has a lower fire load, fewer fireproofing measures are required in order to correctly set up the fireproof electrical network.

The fire load of a specific region of the vehicle is understood to be the energy which is released in the event of a fire in this region, and which must therefore be taken into consideration for protective measures against such a fire.

If the largest possible portion of the fireproof electrical network runs in the region having the lower fire load, fewer fireproofing measures are required.

The invention can be developed by various advantageous embodiments described below.

The second vehicle region cannot be intended for conveying people and/or freight, for example. This has the advantage that regions which are not intended for conveying people and/or freight, e.g. an under floor region of a train, have a lower fire load than e.g. a passenger region. This is accounted for by the fact that passengers in the passenger region take many objects with them which have a high fire load, e.g. items of luggage, newspapers, etc. The passenger region is therefore expected to have a high fire load. Since fewer combustible objects are disposed in other regions, e.g. an under floor region, the fire load is lower in these regions.

The second vehicle region can be arranged below the first vehicle region. It is therefore easy to introduce cabling between the regions, this being necessary in order to connect the smoke alarms with the fire alarm system, for example.

In an advantageous embodiment, the vehicle can have a vehicle body which forms at least one fireproof section in the second vehicle region, and at least part of the fireproof network can be arranged in the fireproof section. This has the advantage that the fireproof section of the vehicle body is utilized for the installation of the fireproof network, which requires fewer fireproofing measures in this section. The vehicle body is the basic structure of the vehicle, being designed as a steel-welded structure, for example.

In an advantageous embodiment, the vehicle may comprise a fire-protective housing in the second vehicle region, in which at least part of the fireproof network is arranged. This has the advantage that parts of the fireproof network can be preassembled in the fireproof housing, thereby simplifying the assembly of the vehicle.

In order to simplify the assembly further, the fireproof network may comprise at least one plug connector by means of which the fireproof network inside the housing can be connected to a network outside the housing. Furthermore, the fireproof network may comprise a plurality of subnetworks having different functionalities which are required in the event of fire in the event of fire, all subnetworks being arranged in the shared housing. Said functionalities may comprise those of a fire alarm system, those required for emergency travel of the vehicle and/or those of a public information system of the vehicle, for example.

In order to reduce the size and the power loss of the fireproof network, the fireproof network may comprise at least one printed circuit board. In a particularly advantageous embodiment, the printed circuit board is arranged in the housing cited above. Printed circuit boards are particularly easy to assemble and require particularly little space.

Furthermore, the fireproof network may comprise at least one switching element, in particular a relay, which is arranged on the circuit board. This has the advantage that the switching element on the circuit board is already pre-cabled at the time of assembly, thereby reducing the assembly expense. Moreover, the power loss of relays is low in comparison with contactors, for example. A low power loss reduces the fire risk, particularly if the switching elements are arranged in the previously cited housing, such that fewer fireproofing measures are required.

BRIEF DESCRIPTION OF THE SEVERAL VIEWS OF THE DRAWING

The invention is explained below with reference to the exemplary embodiment variant in the appended drawings, in which.

DESCRIPTION OF THE INVENTION

Figure 1:
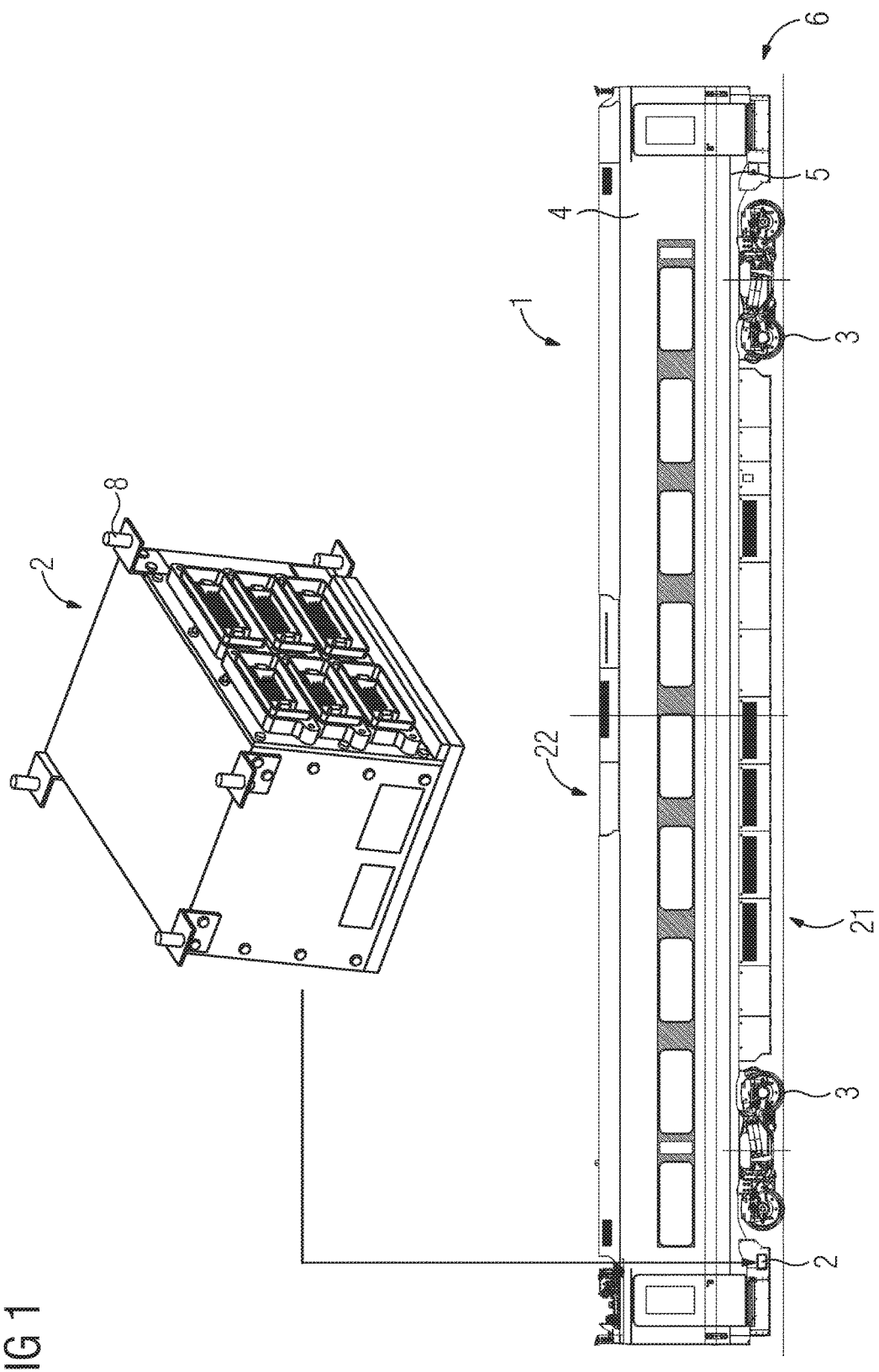
FIG. 1 shows a schematic illustration of a first embodiment variant of a vehicle with an installed fireproofing device according to the invention.

FIG. 1 shows a vehicle 1 in which an exemplary embodiment variant of the inventive fireproofing device 2 is installed. The vehicle here takes the form of a rail-borne vehicle which travels on rails (not shown) by means of its wheels 3. In this case, the vehicle 1 may be part of a train for conveying people. For the purpose of conveying the passengers, the vehicle 1 has a passenger region 4 which is delimited on its underside by a floor 5. An under floor region 6, in which inter alia the fireproofing device 2 is arranged, is situated below the floor 5.

The fireproofing device 2 comprises in particular a housing 7, an internal network 20, fastening means 8, a plurality of plug-type connectors 9 and a plurality of circuit boards 10.

The fireproofing device 2 is described below with reference to FIG. 2. For greater clarity, the fireproofing device 2 in FIG. 2 is shown with its housing 7 partially open (cross section).

The housing 7 of the fireproofing device 2 essentially has the form of a box and is made of sheet metal or other material. The housing 7 consists of a box 11 having an opening 12 at the front and a cover 13 which closes the opening 12 in the closed state in FIG. 2. The cover is connected to the box 11 by means of screws 14 in the closed state of the housing 7 in FIG. 2.

Figure 2:
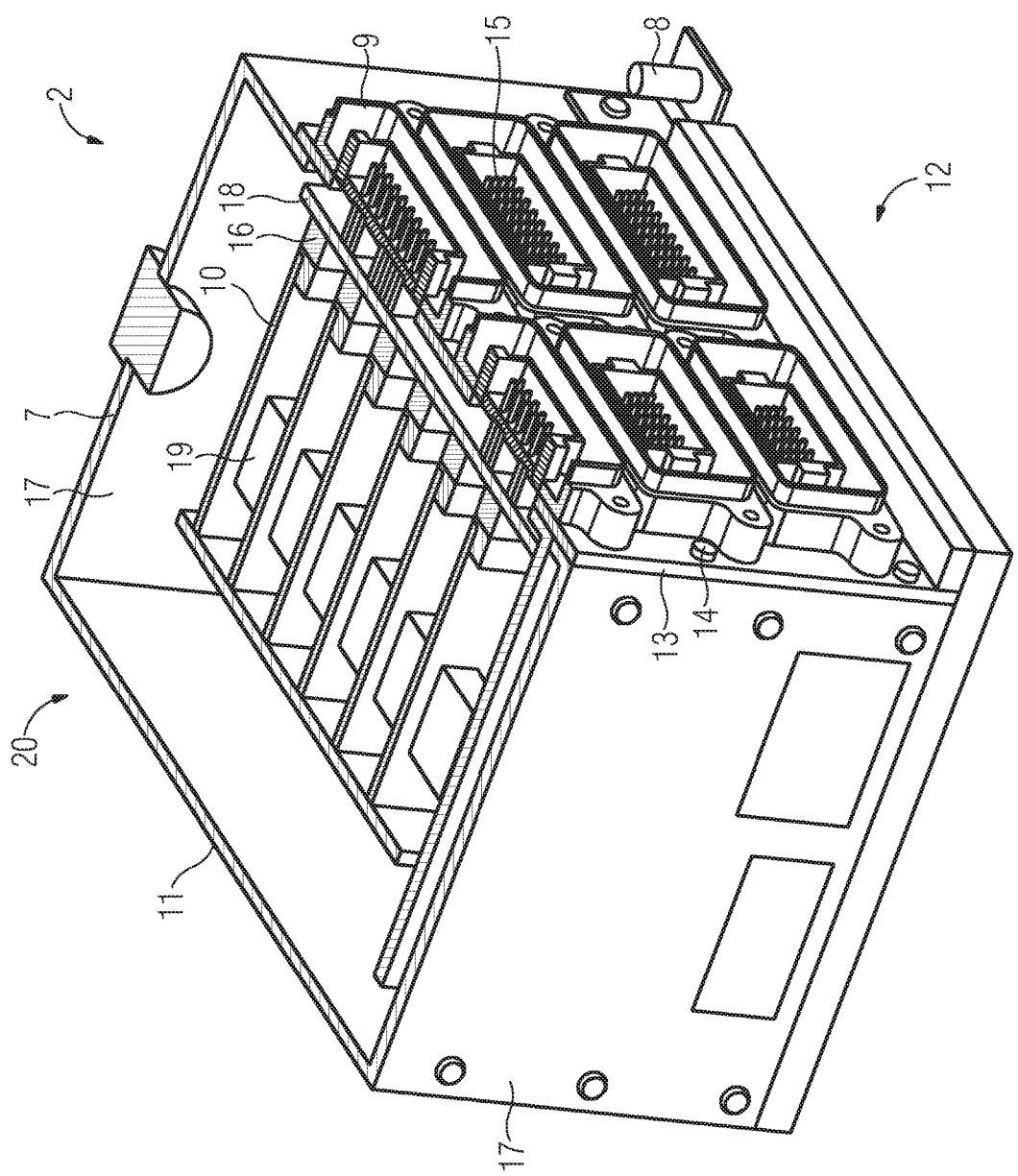
FIG. 2 shows a schematic illustration of the fireproofing device from FIG. 1.
Figure 3:
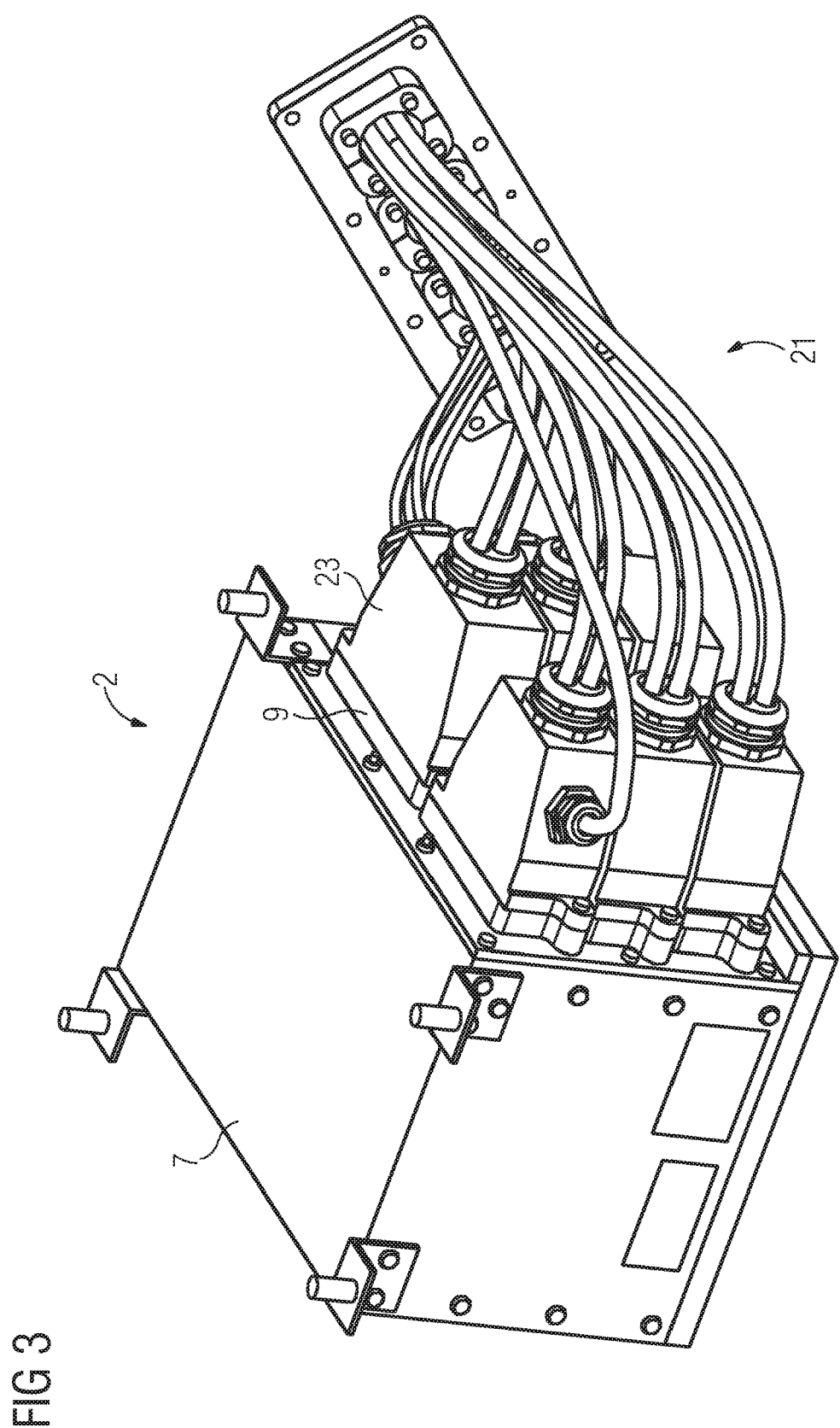
FIG. 3 shows a schematic illustration of the fireproofing device with the connection to the vehicle-based cabling from FIG. 1.

In the case of the embodiment variant according to FIGS. 1 and 2, the plug-type connectors 9 are recessed in the wall, in particular the cover 13, of the housing 7. The plug-type connectors 9 therefore take the form of built-in plug connectors which are permanently installed in the housing 7. The plug-type connectors 9 each have a multiplicity of contact pins 15 which extend outwards from the housing 7 and are connected inside the housing 7 to the internal network 20 of the fireproofing device 2 as explained in greater detail below. In particular, the contact pins 15 are connected on the inner side of the cover 13 to plug connector elements 16 which provide a plug-type connection to the circuit boards 10. In the case of the embodiment variant shown in FIGS. 1 and 2, the fireproofing device 2 comprises six plug-type connectors 9 which are arranged above and beside each other in three rows and two columns.

The circuit boards 10 so installed as to be parallel relative to each other and essentially at right angles to the cover 13, and parallel to the side walls 17 of the housing 7. The circuit boards 10 are in each case plugged into circuit board slots (not shown) of a backplane 18 behind the plug-type connectors 9. The circuit boards 10 in each case take the form of printed circuit boards onto which the components and conductor paths are applied. Printed circuit boards are also referred to as PCBs. Components on the circuit boards include relays 19, DC converters (not shown) and other electrical components. In the case of the exemplary embodiment variant as per FIGS. 1 and 2, one or more functions of the fireproofing device 2 are configured on one of the circuit boards 10 in each case. The circuit boards 10 are nonetheless all identical in terms of their dimensions, and therefore the structural space provided at the various slots of the backplane 18 is sufficient. The plug-in circuit boards 19 can easily be exchanged by virtue of the plug-in contacts of the backplane 18.

The previously cited functions of the fireproofing device 2 as provided by corresponding components and connections on the circuit boards 10 comprise in this case a fire alarm system, an emergency travel device for the vehicle 1 and a public information system, in particular for spoken instructions to the passengers. Relative to the housing 7, the components on the circuit boards 10 can be connected externally via the plug-type connectors 9 and are connected internally via the backplane 18. The internal connection, i.e. the connection inside the housing 7 is required because the different functions provided in the fireproofing device 2 need to communicate with each other. By virtue of the internal connection, the cabling expense outside of the housing 7 can be reduced.

For each plug-type connector 9 of the fireproofing device 2, the vehicle 1 has a reciprocal plug-type connector 23 via which the components inside the fireproofing device 2 communicate with components of an external network 21 of the vehicle 1 outside the housing 7. Such components of the external network 21 in the vehicle 1 may be e.g. loudspeakers, sensors, energy supply, light fittings, signal lines, etc.

Components which, in the event of a fire in the vehicle 1, require particular protection from the effects of fire are arranged in the fireproofing device 2. These components provide functions of the vehicle 1 which must continue to function for at least a specified time during or in the event of a fire. As mentioned above, these functions may include continued travel of the vehicle, output of passenger information and a fire alarm system, for example. Said functions must continue to function for a specified time in the event of a fire. To this end, the fireproof device 2 must provide a certain fire resistance, in particular by virtue of the housing 7. The level of resistance to fire depends on the so-called fire load of the installation location.

The fire load of a specific region of the vehicle is understood to be the energy which is released in the event of a fire in this region, and which must therefore be taken into consideration for protective measures against such a fire.

The fire load of the passenger region 4 of the vehicle 1 is greater than the fire load of the under floor region 6. This is accounted for by the fact that passengers in the passenger region take many objects with them which have a high fire load, e.g. items of luggage, newspapers, etc. Since fewer combustible objects are arranged in the under floor region 6, the fire load of the under floor region 6 is lower. Since the fireproofing device 2 in the vehicle 1 is arranged in the under floor region 6, the housing 7 need not offer the same degree of fireproofing or flame barriers as would be required if the fireproofing device 2 was arranged in the passenger region 4. The arrangement of the fireproofing device 2 in the under floor region 6 is therefore advantageous. Since many other devices of the vehicle 1 are likewise arranged in the under floor region 6, the cabling to and from the fireproofing device 2 is also easier by virtue of the fact that these are arranged in the under floor region 6. Since all of the switching elements of the vehicle 1, said switching elements requiring particular protection against fire, are arranged in the one housing of the fireproofing device 2, only one housing 7 is necessary.

By virtue of the plug-type connectors 9 and the fastening means 8, the fireproofing device 2 can be assembled and connected in the vehicle 1 particularly quickly. By virtue of the modular embodiment of the fireproofing device 2 with the plug-type connectors 9 and the enclosed housing 7, the fireproofing device 2 can be preassembled and tested separately from the vehicle 1. Furthermore, in the event of a fault during operation, the fireproofing device 2 can be removed in the vehicle 1 and replaced by a new fireproofing device 2 particularly quickly and easily. Once it has been removed, the faulty fireproofing device 2 can then be repaired and tested separately from the vehicle 1, without the vehicle 1 failing.

Depending on the embodiment (number and configuration of the circuit boards 10), the fireproofing device 2 may allow a maximum number of possible functions or be configured for only a given carriage-specific function. In the first case, the fireproofing device 2 is always identical for each vehicle 1, the required functions being only carriage-specific functions provided via reciprocal plug-type connectors 23 and an external electrical network 2, wherein this nonetheless results in different embodiments of the fireproofing device 2.

By virtue of using relays instead of previously conventional contactors, relatively little heat is generated in the housing 7 of the fireproofing device 2, and therefore the danger of a fire in the interior of the fireproofing device 2 is slight. Since relays are small and lightweight in comparison with contactors, the volume and the weight of the fireproofing device 2 are relatively modest.

The circuit boards 10, plug connector elements 16 and backplane 18 arranged inside the housing 7 form the internal electrical network 20. The electrical network running outside the housing 7 of the fireproofing device 2 in the vehicle 1 represents the external electrical network 21. The plug-type connectors 9 of the fireproofing device 2 are connected to the internal network 20. The external network 21 of the vehicle 1 is itself connected to the reciprocal plug-type connectors 23, which are connected to the plug-type connectors 9 to form a plug-type connection.

The vehicle 1 has a fireproof electrical network 22 which includes the fireproofing device 2 and all other electrical components of the vehicle 1 that are protected against fire. These components comprise e.g. fireproof cables, loudspeakers, emergency lighting, etc.

The invention claimed is:

1. A vehicle for conveying at least one of people or freight, the vehicle comprising:
   at least one first vehicle region having a first fire load, said at least one first vehicle region being configured for conveying people or freight;
   at least one second vehicle region having a second fire load being smaller than said first fire load, said at least one second vehicle region not being configured for conveying people or freight, wherein said at least one first vehicle region is located above a floor of the vehicle and said at least one second vehicle region is located below the floor of the vehicle;
   a fireproofing device including a fire-protective housing disposed in said at least one second vehicle region;
   at least one fireproof electrical network, at least part of said at least one fireproof electrical network being disposed in said fire-protective housing; and
   said fireproofing device including at least one circuit board disposed in said fire protective housing, said fireproofing device configured to function as a device selected from the group consisting of a fire alarm system, an emergency travel device for the vehicle, and a public information system; and
   a network being external to said housing, said at least one fireproof electrical network including at least one plug connector for connecting said part of said at least one fireproof electrical network inside said housing to said network external to said housing;
   said housing including a wall with said plug connector disposed therein, said at least one circuit board extending in a direction away from said wall of said housing.

2. The vehicle according to claim 1, which further comprises a body of the vehicle forming at least one fireproof section in said at least one second vehicle region, at least part of said at least one fireproof electrical network being disposed in said at least one fireproof section.

3. The vehicle according to claim 1, wherein said at least one fireproof electrical network includes a plurality of sub networks having different functionalities required in an event of a fire, all of said sub networks being disposed in said housing.

4. The vehicle according to claim 1, wherein said at least one fireproof electrical network includes at least one switching element disposed on said at least one circuit board.

5. The vehicle according to claim 4, wherein said at least one switching element is at least one relay.

6. A vehicle for conveying at least one of people or freight, the vehicle comprising:
   at least one first vehicle region having a first fire load, said at least one first vehicle region being configured for conveying people or freight and being delimited by a component;
   at least one second vehicle region having a second fire load being smaller than said first fire load, said at least one second vehicle region not being configured for conveying people or freight, wherein said at least one first vehicle region is located on one side of said component and said at least one second vehicle region is located on another side of said component;
   a fireproofing device including a fire-protective housing disposed in said at least one second vehicle region;
   at least one fireproof electrical network, at least part of said at least one fireproof electrical network being disposed in said fire-protective housing in said at least one second vehicle region;
   said fireproofing device including at least one circuit board disposed therein, said fireproofing device configured to function as a device selected from the group consisting of a fire alarm system, an emergency travel device for the vehicle, and a public information system; and
   a network being external to said housing, said at least one fireproof electrical network including at least one plug connector for connecting said part of said at least one fireproof electrical network inside said housing to said network external to said housing;
   said housing including a wall with said plug connector disposed therein, said at least one circuit board extending in a direction away from said wall of said housing.

* * * * *